United States Patent
Nakasha

(10) Patent No.: US 7,679,469 B2
(45) Date of Patent: Mar. 16, 2010

(54) IMPULSE GENERATOR UTILIZING NONLINEAR TRANSMISSION LINE

(75) Inventor: Yasuhiro Nakasha, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 12/031,365

(22) Filed: Feb. 14, 2008

(65) Prior Publication Data

US 2008/0203825 A1 Aug. 28, 2008

(30) Foreign Application Priority Data

Feb. 26, 2007 (JP) ............................. 2007-045925

(51) Int. Cl.
*H04B 3/04* (2006.01)
(52) U.S. Cl. ............................. 333/20; 327/164; 333/33
(58) Field of Classification Search .................. 333/20, 333/33; 327/164
See application file for complete search history.

(56) References Cited

U.S. PATENT DOCUMENTS

| | | | | |
|---|---|---|---|---|
| 4,267,538 A | * | 5/1981 | Assal et al. | ................. 333/262 |
| 4,837,532 A | * | 6/1989 | Lang | ........................... 333/164 |
| 5,352,994 A | * | 10/1994 | Black et al. | ................... 333/33 |
| 5,825,240 A | * | 10/1998 | Geis et al. | .................... 327/570 |
| 6,826,208 B1 | | 11/2004 | Birk | |
| 2007/0008048 A1 | | 1/2007 | Kintis et al. | |

OTHER PUBLICATIONS

C.J.Madden et al, "*Generation of 3.5-ps Fall-Time Shock Waves on a Monolothic GaAs Nonlinear Transmission Line*", Jun. 1988, pp. 303-305, vol. 9, IEEE Electron Device Letters.

* cited by examiner

*Primary Examiner*—Lincoln Donovan
*Assistant Examiner*—Ryan C Jager
(74) *Attorney, Agent, or Firm*—Arent Fox LLP

(57) ABSTRACT

The impulse generator comprises a nonlinear transmission line capable of obtaining an impulse with a small half value width and a large amplitude, in which a plurality of transmission line units having a unit line unit and a diode are connected in series, a pulse generator connected to the transmission terminal of the nonlinear transmission line, and a bias-dependent element connected to the reception terminal of the nonlinear line, wherein the anode of the diode of the transmission line unit is connected to the transmission line and the cathode is connected to the ground, and one end of the bias-dependent element is connected to the reception terminal of the transmission line and the other end is biased to a negative potential.

11 Claims, 9 Drawing Sheets

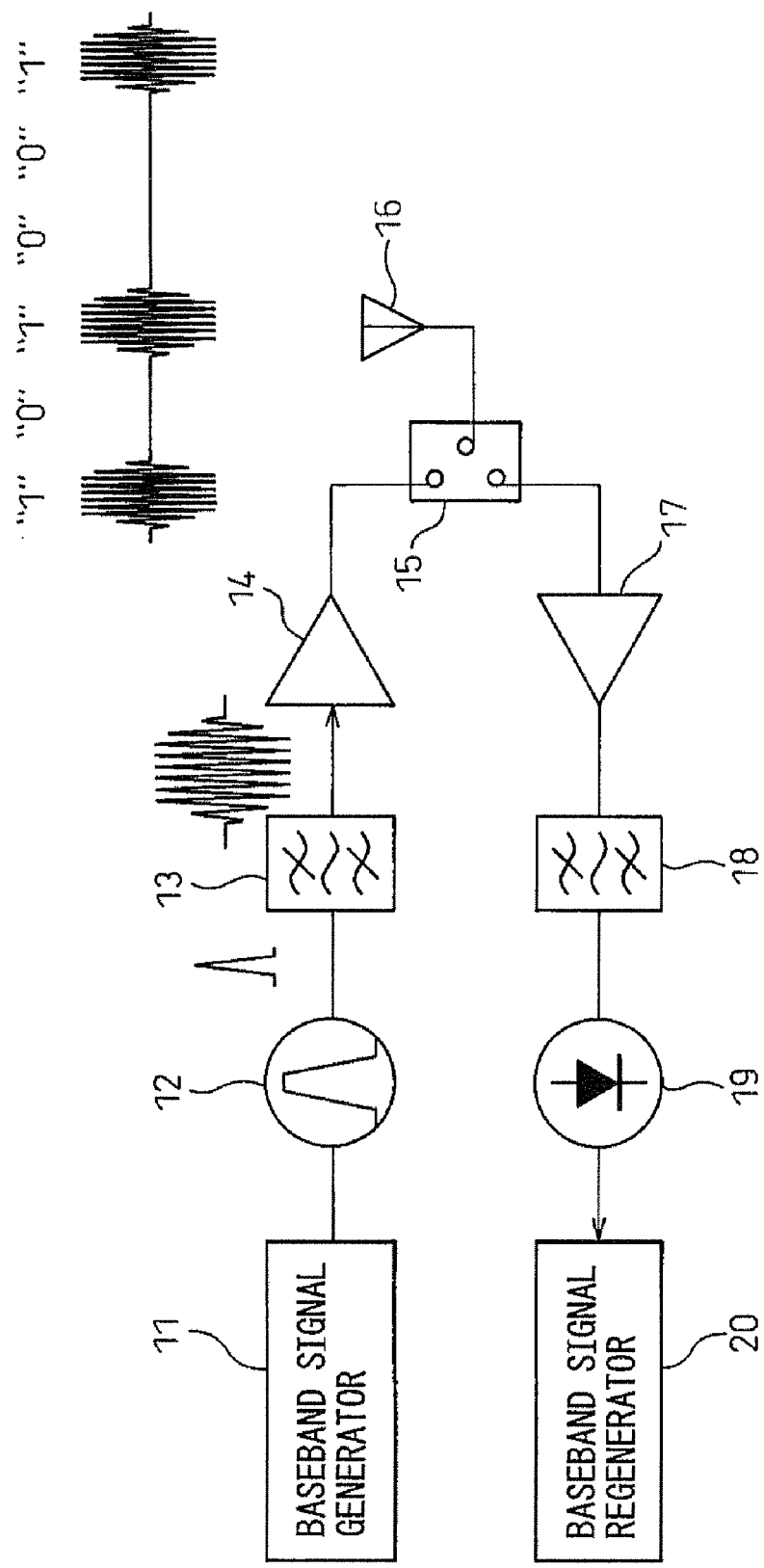

IMPULSE GENERATOR UTILIZING NONLINEAR TRANSMISSION LINE

CROSS-REFERENCE TO RELATED APPLICATION

This application is based upon and claims priority from prior Japanese Patent Application No. 2007-045925, filed on Feb. 26, 2007, the entire contents of which are incorporated herein by reference.

BACKGROUND OF THE INVENTION

The technique described herein relates to an impulse generator that generates an extremely thin pulse, and more specifically, to an impulse generator that utilizes a nonlinear transmission line of which a diode is connected.

An impulse output from an impulse generator includes frequency components in a wide range from direct current to high frequencies, and therefore, an impulse generator is widely utilized in a wide band radio communication system or a measuring system for generating a sampling pulse of an oscilloscope.

FIG. 1 is a diagram showing an example of an impulse generator in a wide band radio communication system. As shown in FIG. 1, a baseband (oscillation) signal generated by a baseband signal generator 11 is modulated by an impulse generated by an impulse generator 12 and after being filtered by a band pass filter 13, it is amplified in a transmission amplifier 14 and transmitted from an antenna 16 via a transmission/reception switching switch 15. On the other hand, radio waves received by transmission antenna 16 are transmitted to a receiving amplifier via transmission/reception switching switch 15 and amplified therein, and then, filtered by band pass filter 13, detected in a detector 19, and regenerated in a baseband signal regenerator 20.

As shown schematically, in the signal transmitted from antenna 16, parts where an impulse is present correspond to a data value "1" and parts where no impulse is present correspond to a data value "0". In order to increase the amount of information that can be transmitted, the time is required to be shortened (data width) for a datum and therefore to make an impulse narrower.

Among impulse generators, an impulse generator that utilizes a nonlinear transmission line is capable of generating an extremely thin pulse, the half value width of which is several picoseconds due to the effect of reduction in pulse width by the non-linearity of the transmission line. The impulse generator can be applied to a next generation wide band radio communication system or measuring system.

An impulse generator using a nonlinear transmission line is described in, for example, "Generation of 3.5-ps fall-time shock waves on a monolithic GaAs nonlinear transmission line", Madden, C. J.: Rodwell, M. J. W.; Marslanad, R. A.; Bloom, D. M.; Pao, Y. C., IEEE Electron Device Letters vol. 9, no. 6 Page(s): 303-305 1988.

FIG. 2A and FIG. 2B are diagrams showing an impulse generator that uses the nonlinear transmission line described in the above document: FIG. 2A shows its configuration; and FIG. 2B shows the characteristics (input signal and output signal) of the impulse generator. As shown in FIG. 2A, an impulse generator that uses a conventional nonlinear transmission line has a pulse generation source 21 that generates a pulse signal, a nonlinear transmission line 22 in which a plurality of transmission line units, such as a transmission line unit having a unit line unit P1 and a diode D1, a transmission line unit having P2 and D2, a transmission line unit having P3 and D3, etc., are connected in series, a terminating resistor 23, and an input resistor 24. As shown in FIG. 2B, when a pulse from the pulse generation source 21 is input to the transmission terminal of the line, in the course of propagation of the pulse signal through the line, the fall of the signal gradually becomes steeper due to the non-linearity effect of the diode.

SUMMARY OF THE INVENTION

According to an aspect of an embodiment, there is an impulse generator comprising: a nonlinear transmission line in which a plurality of transmission line units having a unit line unit and a diode are connected in series; a pulse generator connected to the transmission terminal of the nonlinear transmission line; and a bias-dependent element connected to the reception terminal of the nonlinear transmission line, wherein the anode of the diode of the transmission line unit is connected to the transmission line and the cathode is connected to the ground, and wherein one end of the bias-dependent element is connected to the reception terminal of the transmission line and the other end is biased to a negative potential.

BRIEF DESCRIPTION OF THE DRAWINGS

The features and advantages will be more clearly understood from the following description taken in conjunction with accompanying drawings, in which:

FIG. 1 is a diagram explaining a use example of an impulse generated in an impulse generator.

DESCRIPTION OF THE PREFERRED EMBODIMENTS

Figure 3A:
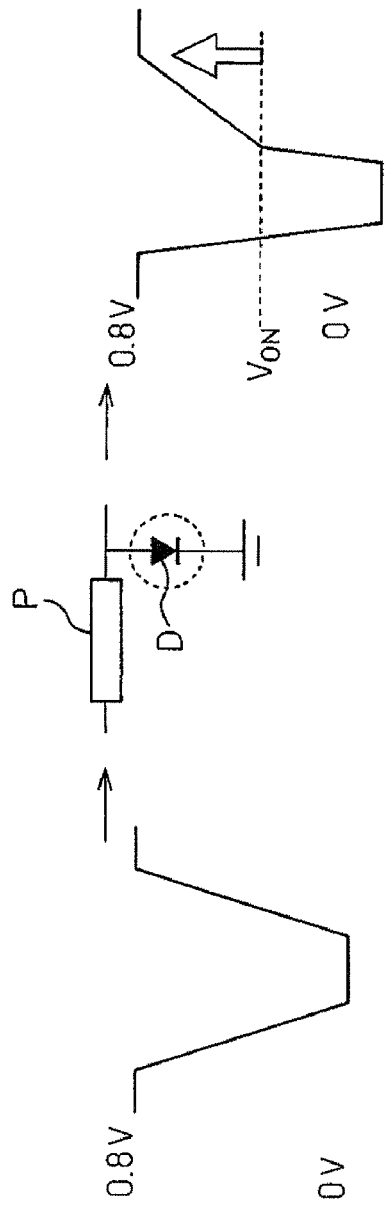
FIG. 3A and FIG. 3B are diagrams explaining the cause of a tail becoming dull in a conventional example.
Figure 3B:
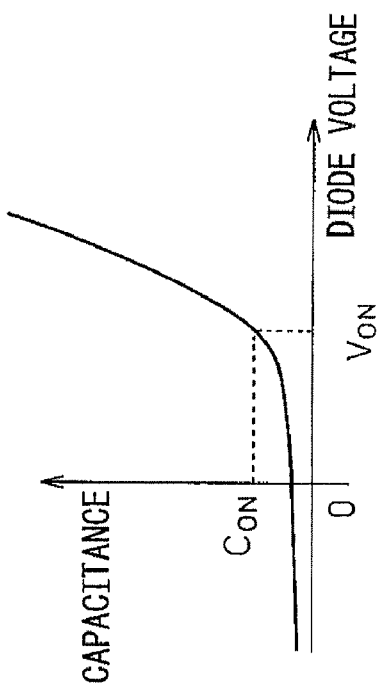

The reason why the rise tail becomes dull in an impulse generator that utilizes a conventional nonlinear transmission line will be explained with reference to FIG. 3A and FIG. 3B before the explanation of embodiments are given. As shown in FIG. 3A, it is assumed that a pulse that drops from 0.8 V to 0 V and then returns to 0.8 is input. The capacitance between terminals of a diode D constituting a nonlinear transmission line has a dependence on the voltage between terminals across the diode as shown in FIG. 3B, i.e., the capacitance between terminals increases with the voltage V between terminals of $$V^{\frac{3}{2}}$$

to $V^2$. As a result, when the voltage between terminals is $V_{ON}$ or higher, the voltage between terminals increases rapidly. For the signal that propagates through the nonlinear transmission line, the diode capacitance is small when the voltage level is $V_{ON}$ or lower and the diode capacitance increases rapidly when the voltage level is $V_{ON}$ or higher as a result. Here, the propagation speed of the diode capacitance is expressed in $(LC)^{-1/2}$ (L: line inductance, C: line capacitance). Because of this, when the signal level is $V_{ON}$ or lower, the capacitance of the diode is small, the propagation speed increases, and the signal changes rapidly. In contrast to this, when the signal level is $V_{ON}$ or higher, the diode capacitance increases rapidly, the propagation speed decreases, and the change of the signal becomes more gradual. As a result, the tail appears.

Figure 4A:
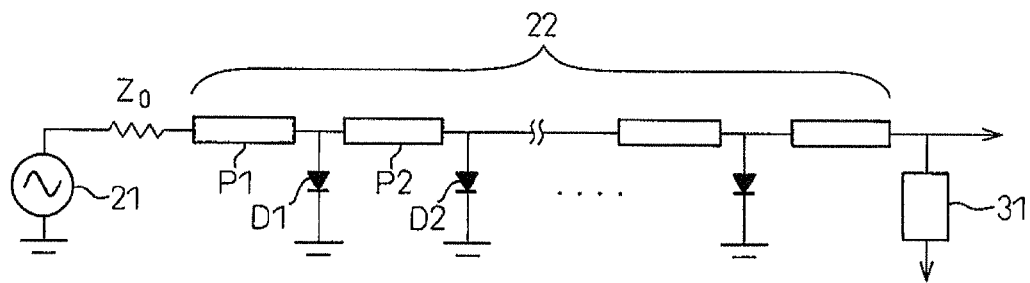
FIG. 4A to FIG. 4C are diagrams explaining the principle of an impulse generator in an embodiment.

In contrast to this, a bias-dependent element 31 is connected to the reception terminal of the nonlinear transmission line 22 as shown in FIG. 4A. One terminal of the bias-dependent element 31 is connected to the reception terminal of the transmission line and the other terminal is biased to a power source at a predetermined potential.

Figure 4B:
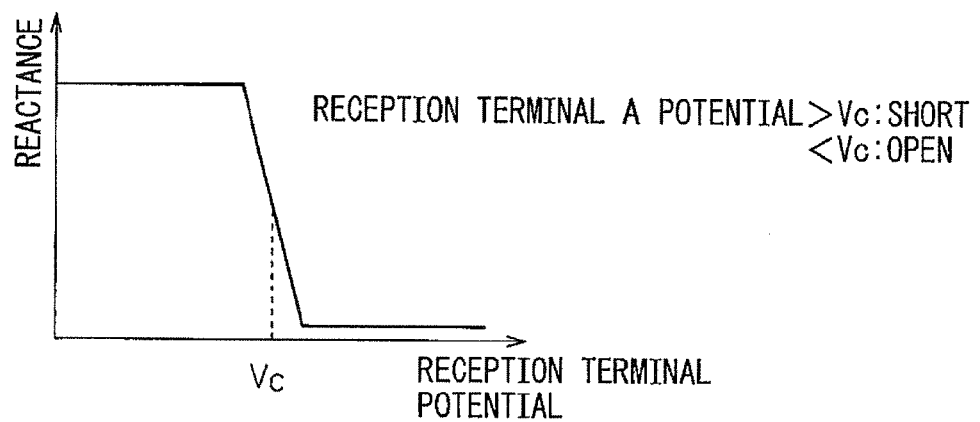
Figure 4C:
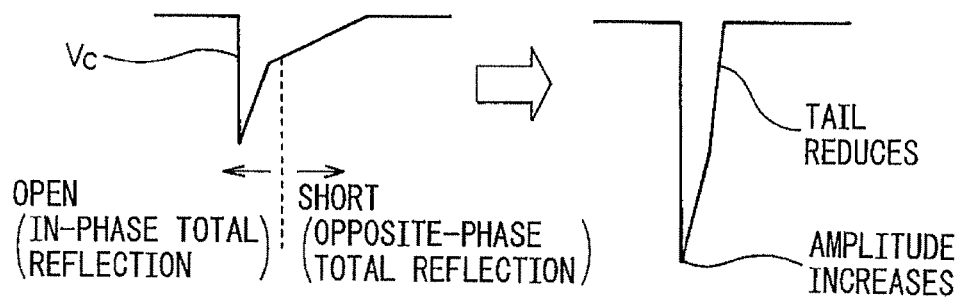

As shown in FIG. 4B, the reactance of bias-dependent element 31 has the characteristic that it has a large value when the voltage between terminals is lower than a predetermined value Vc and has a small value when the voltage between terminals is greater than the predetermined value Vc. As a result, the signal that has reached the reception terminal is input to a circuit in an open state when the level is low and to a circuit in a short-circuited state when the level is high. As shown in FIG. 4C, when the signal having a tail reaches the part of bias-dependent element 31 from the nonlinear transmission line, the part near the pulse peak at which the amplitude is large becomes open, and therefore, in-phase total reflection occurs, and the total potential of the incident wave and reflected wave at the reception terminal is doubled at the maximum. In contrast to this, the part at which the tail appears and the amplitude is small is short-circuited, and therefore, an opposite-phase total reflection occurs. As a result, the incident wave and the reflected wave cancel out each other to form the total potential and the tail decreases. As a result of the reduction of the tail, the pulse amplitude also increases.

Figure 5:
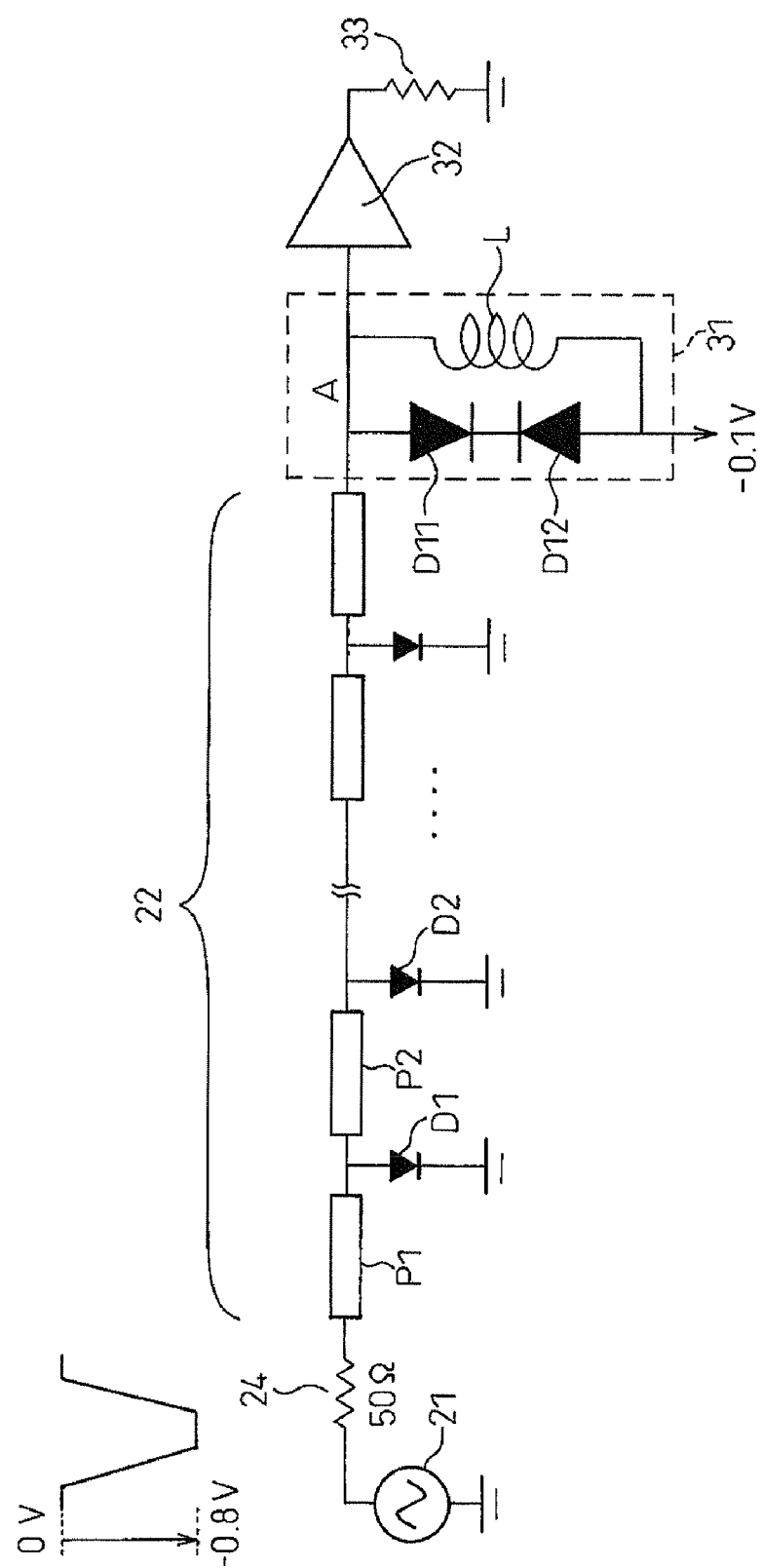
FIG. 5 is a diagram showing a configuration of an impulse generator in an embodiment.

FIG. 5 is a diagram showing the configuration of the impulse generator in the embodiment.

As shown schematically, the impulse generator in the embodiment has a pulse generation source 21, a nonlinear transmission line 22 in which a plurality of transmission line units, such as a transmission line unit having a unit line unit P1 and a diode D1, a transmission line unit having P2 and D2, etc., are connected in series, an input resistor 24, a bias-dependent element 31, and an amplifier 32.

Nonlinear transmission line 22 is realized using coplanar lines (line width 20 μm, gap 15 μm) P1, P2, . . . , formed on a InP substrate and gate Schottky diodes D1, D2, . . . , of high electron mobility transistors (HEMT) formed on the InP substrate. The length of transmission lines P1, P2, . . . , is 48 μm, respectively, and the gate width of diodes D1, D2, . . . , is 20 μm, respectively. Impedance $Z_0$ of transmission lines P1, P2, . . . , is 50Ω. As shown schematically, one end (anode) of diodes D1, D2, . . . , is connected to the line and the other end (cathode) is grounded. At the transmission terminal, 50Ω input resistor 24 is provided and a pulse signal that drops from 0 V to −0.8 V and then returns to 0 V, as shown schematically, is input from pulse generation source 21 via input resistor 24. The bias-dependent element 31 has a circuit configuration in which two diodes D11 and D12 having a gate length of 0.48 μm and a gate width of 5 μm are connected with their cathodes opposing each other and further a 0.3 nH inductance L is connected in parallel to its both ends. One end of bias-dependent element 31 is connected to the reception terminal of nonlinear transmission line 22 and the other end is biased to −0.1 V. When the two diodes are opposed each other, the capacitance value is large when the bias is low and the capacitance value is small when the bias is high, and thus a characteristic similar to the characteristic shown in FIG. 4B can be obtained. As a result, the length of the tail is reduced by the action as described above.

In order to obtain a larger impulse amplitude, the reactance of diodes D11 and D12 used as bias-dependent element 31 is made to have a value larger compared to the characteristic impedance of nonlinear transmission line 22. Inductance L is arranged with attention being paid to the fact that the frequency components contained are different between the part near the peak value at which the pulse changes rapidly and the tail part at which the pulse changes gradually. The pulse changes gradually at the tail part, and therefore, the inductance is substantially short-circuited and the change is rapid at the pulse peak part, and therefore, the inductance is substantially opened. In this manner, inductance L also serves to reduce the length of the tail. As explained above, diodes D11 and D12 connected in opposition to each other and inductance L increase the effect of reduction in the length of the tail and the increase in the pulse amplitude.

Figure 6:
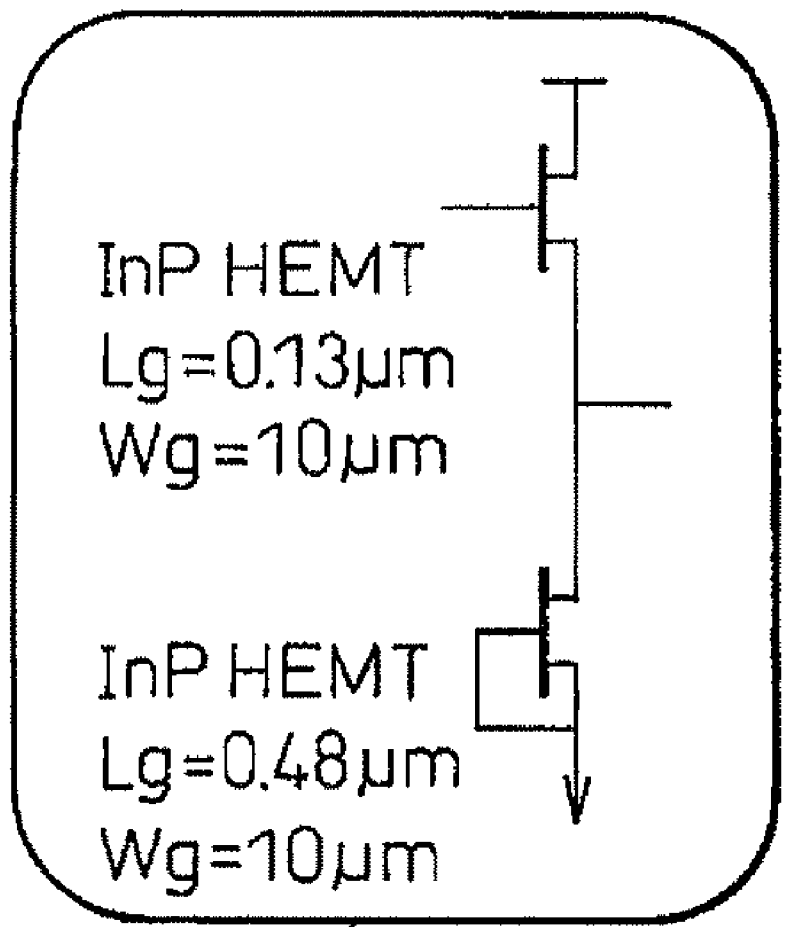
FIG. 6 is a diagram showing a configuration of an amplifier used in an impulse generator in an embodiment.

FIG. 6 is a diagram showing a circuit configuration of amplifier 32. As shown schematically, amplifier 32 is composed of a source follower circuit in which two InP HEMTs with a gate length of 0.13 μm and a gate width of 20 μm are connected in series. The input impedance of the amplifier is 5 kΩ.

Figure 2A:
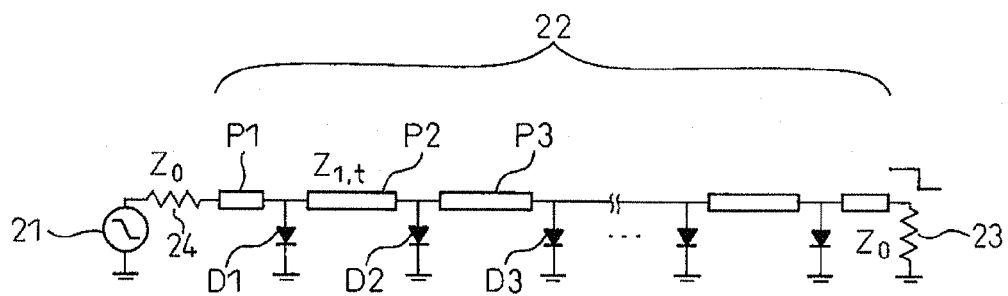
FIG. 2A and FIG. 2B are diagrams showing a configuration and a circuit characteristic of an impulse generator that utilizes a conventional nonlinear transmission line.
Figure 2B:
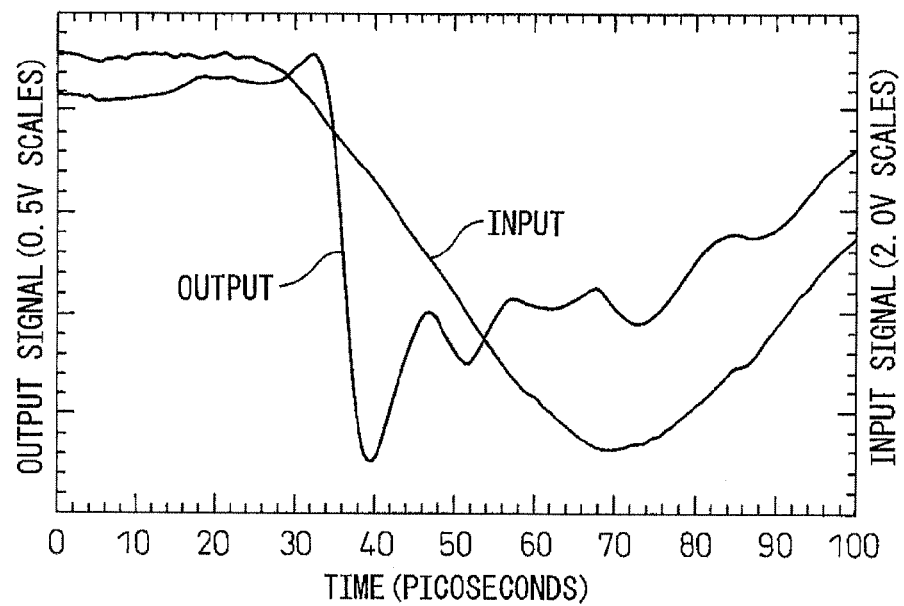
Figure 7:
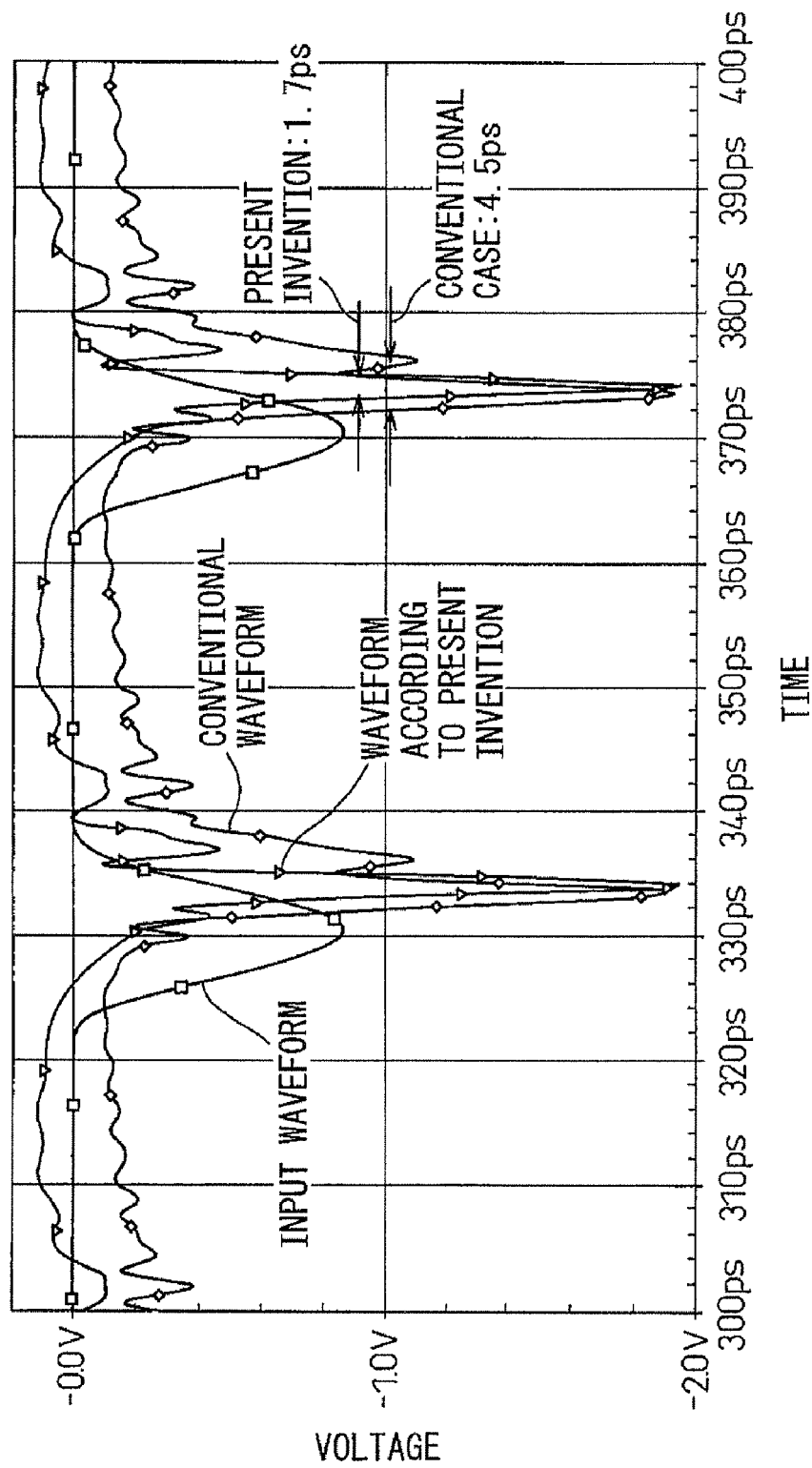
FIG. 7 is a diagram showing an output signal characteristic (circuit characteristic) of an impulse generator in an embodiment.

FIG. 7 shows output signal waveforms when a pulse with a pulse width of 10 ps and an amplitude of 0.8 V (from 0 V to −0.8 V) is applied to the impulse generator in the embodiment in FIG. 5. In addition, FIG. 7 also shows, for reference, output signal waveforms when the same pulse is applied with the configuration in which an amplifier is added at the reception terminal in the conventional circuit in FIG. 2. In either example, the input impedance of the amplifier is 5 kΩ. The wire length between bias-dependent element 31 and amplifier 32 is 50 μm. If bias-dependent element 31 and amplifier 32 are not sufficiently close to each other, the effect by the bias-dependent element cannot be obtained because the phase of the signal changes therebetween. Because of this, it is desirable that bias-dependent element 31 and amplifier 32 be arranged so that the distance therebetween is the shortest. The distance 50 μm in the present embodiment is a sufficiently short distance from the above standpoint and the effect by the bias-dependent element 31 can be obtained. If nonlinear transmission line 22, bias-dependent element 31, and source follower amplifier 32 are integrated on the InP substrate, it is sufficiently possible to arrange bias-dependent element 31 and amplifier 32 as close to each other as about 50 μm.

As shown in FIG. 7, while the half value width is 4.5 ps and the pulse width from the peak value is 0.8 V in the conventional circuit because of a large tail, in the circuit in the present embodiment, they have been improved considerably, such as that the half value width is 1.7 ps and the pulse width from the peak value is 1.4 V. In other words, the pulse half value width has been reduced to 38% and the pulse amplitude has increased to 175% of the conventional one. In addition, as shown in FIG. 7, the voltage value of the pulse rises after decreasing to the peak value; however, there appears a small peak during the way returning to 0 V. When used as a pulse signal, the effective pulse base is the width until the peak appears, and therefore, this part is assumed to be the base and the potential difference from the peak value is assumed to be the pulse amplitude, and thus, the half value width is defined by the part at which the value is half that from the base to the peak value.

Figure 8:
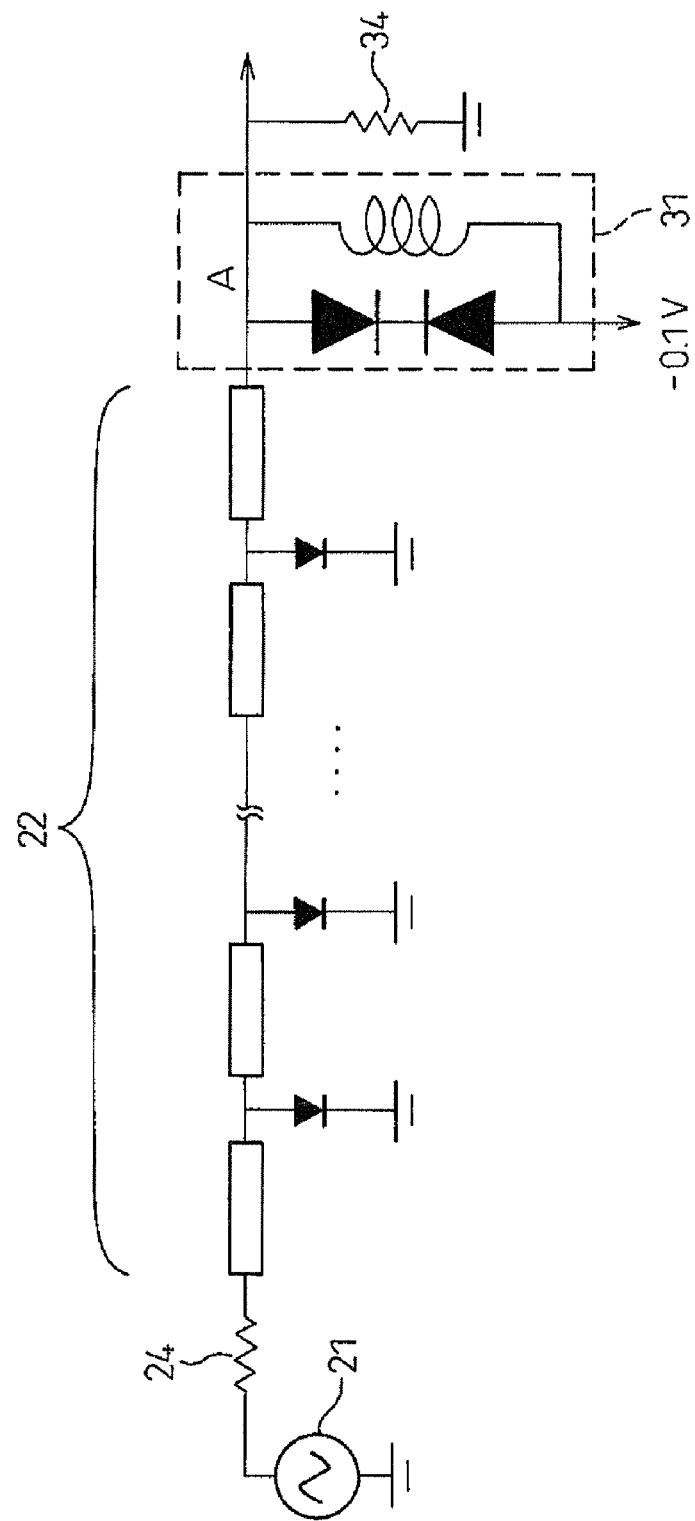
FIG. 8 is a diagram showing a configuration of a modification example of an impulse generator in an embodiment.

FIG. 8 is a diagram showing the configuration of a modification example of the impulse generator in the embodiment in FIG. 5. The modification example in FIG. 8 is an example in which amplifier 32 is removed and a 50Ω terminating resistor 34 is connected to the reception terminal in series in the configuration of the impulse generator in FIG. 5. In addition, it is also possible to connect amplifier 32 to the reception terminal in FIG. 8 and it can be regarded as a case where the amplifier with an input impedance of 50Ω is used as amplifier 32 in the configuration in FIG. 5.

Figure 9:
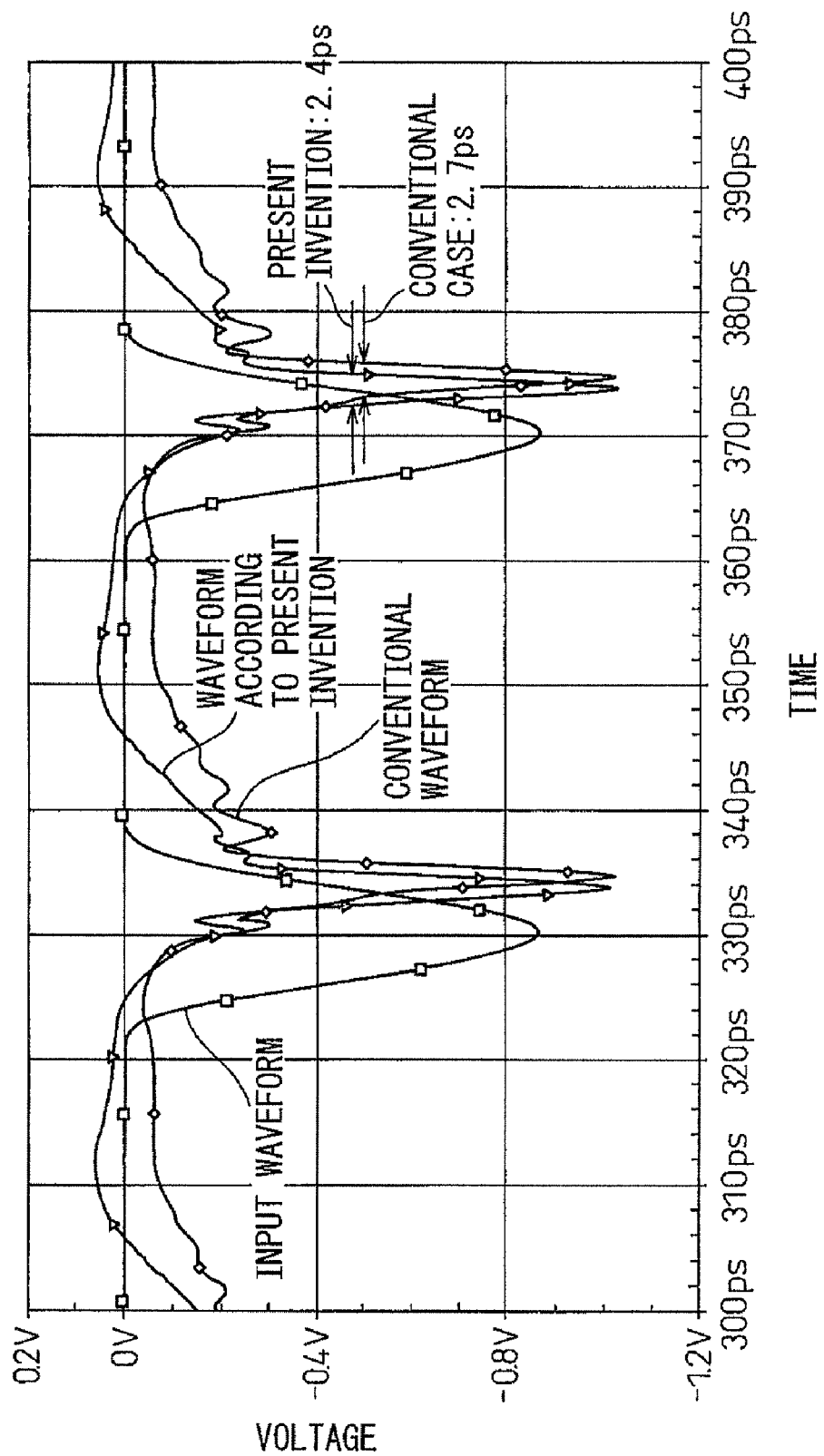
FIG. 9 is a diagram showing an output signal characteristic (circuit characteristic) of an impulse generator in an embodiment.

FIG. 9 shows the circuit characteristic in the modification example in FIG. 8, that is, the output signal waveforms under the same condition as that in FIG. 7. In this case, while the half value width is 2.7 ps and the pulse width from the peak value is 0.68 V in the conventional circuit, in the circuit in the modification example, they have been improved considerably, such as that the half value width is 2.4 ps and the pulse width from the peak value is 0.75 V. As a result, the pulse half value width has been reduced to 90% of the conventional one and the pulse width has increased to 110% of the conventional one.

Generally as a reception terminal of a transmission line, a resistive element that matches the characteristic impedance of the line is used. However, in the case of the impulse generator that utilizes a non-linear transmission line, it is not possible to remove the imperfection of the waveform by a terminating resistor. When a non-linear transmission line is utilized, a technique to shape waveforms by utilizing a bias-dependent element as a terminating element is effective, as shown in the present invention.

The above configuration can be applied to the impulse generator that utilizes a non-linear transmission line.

Due to the above configuration, a very narrow impulse can be generated, and therefore, it is useful to realize a next generation ultra wide band radio transmission system or a very high-speed sampling oscilloscope.

I claim:

1. An impulse generator comprising:
   a nonlinear transmission line in which a plurality of transmission line units having a unit line unit and a diode are connected in series;
   a pulse generator connected to the transmission terminal of the nonlinear transmission line; and
   a bias-dependent element connected to the reception terminal of the nonlinear transmission line,
   wherein an anode of the diode of the transmission line unit is connected to the transmission line and a cathode is connected to a ground,
   wherein one end of the bias-dependent element is connected to the reception terminal of the transmission line and the other end is biased to a negative potential, and
   wherein the bias-dependent element comprises two diodes connected with respective cathode electrodes being opposed to each other and an inductance connected in parallel to the two diodes.

2. The impulse generator as set forth in claim 1, further comprising an amplifier connected to the reception terminal of the transmission line.

3. The impulse generator as set forth in claim 2, wherein the bias-dependent element has a characteristic that its reactance is large when a voltage between terminals of the bias-dependent element is less than a predetermined value and the reactance is small when the voltage between terminals is greater than the predetermined value.

4. The impulse generator as set forth in claim 2, wherein the bias-dependent element comprises two diodes connected with respective cathode electrodes being opposed to each other and an inductance connected in parallel to the two diodes.

5. The impulse generator as set forth in claim 2, wherein the amplifier has a high input impedance.

6. The impulse generator as set forth in claim 1, further comprising a terminating resistor connected to the reception terminal of the transmission line.

7. The impulse generator as set forth in claim 6, wherein the bias-dependent element has a characteristic that its reactance is large when a voltage between terminals of the bias-dependent element is less than a predetermined value and the reactance is small when the voltage between terminals is greater than the predetermined value.

8. The impulse generator as set forth in claim 6, wherein the bias-dependent element comprises two diodes connected with respective cathode electrodes being opposed to each other and an inductance connected in parallel to the two diodes.

9. The impulse generator as set forth in claim 1, wherein the bias-dependent element has a characteristic that its reactance is large when a voltage between terminals of the bias-dependent element is less than a predetermined value and the reactance is small when the voltage between terminals is greater than the predetermined value.

10. The impulse generator as set forth in claim 9, wherein the bias-dependent element comprises two diodes connected with respective cathode electrodes being opposed to each other and an inductance connected in parallel to the two diodes.

11. The impulse generator as set forth in claim 1, wherein the bias-dependent element comprises two diodes connected with respective cathode electrodes being opposed to each other and an inductance connected in parallel to the two diodes.

* * * * *